(12) United States Patent  (10) Patent No.: US 9,343,568 B2
Chan  (45) Date of Patent: May 17, 2016

(54) SEMICONDUCTOR DEVICE HAVING HIGH-RESISTANCE CONDUCTOR STRUCTURE, METHOD OF MANUFACTURING THE SAME AND METHOD OF OPERATING THE SAME

(71) Applicant: MACRONIX International Co., Ltd., Hsinchu (TW)

(72) Inventor: Wing-Chor Chan, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 38 days.

(21) Appl. No.: 14/275,580

(22) Filed: May 12, 2014

(65) Prior Publication Data

US 2015/0325694 A1  Nov. 12, 2015

(51) Int. Cl.
*H01L 21/8238* (2006.01)
*H01L 29/78* (2006.01)
*H01L 29/866* (2006.01)
*H01L 29/10* (2006.01)
*H01L 29/66* (2006.01)
*H01L 27/06* (2006.01)
*H03K 17/687* (2006.01)

(52) U.S. Cl.
CPC ........ *H01L 29/7821* (2013.01); *H01L 27/0629* (2013.01); *H01L 29/1095* (2013.01); *H01L 29/66681* (2013.01); *H01L 29/866* (2013.01); *H03K 17/687* (2013.01)

(58) Field of Classification Search
CPC ............... H01L 27/7821; H01L 29/66681; H01L 29/1095; H01L 29/866; H01L 27/0629
See application file for complete search history.

(56) References Cited

U.S. PATENT DOCUMENTS

| 4,244,000 A | * | 1/1981 | Ueda | H01L 27/1443 257/110 |
| 2002/0000568 A1 | * | 1/2002 | Ohshima | H01L 27/0255 257/175 |
| 2006/0022265 A1 | * | 2/2006 | Yoshida | H01L 29/7801 257/335 |

FOREIGN PATENT DOCUMENTS

JP  2008021735  1/2008
TW  201409694  3/2014

OTHER PUBLICATIONS

"Office Action of Taiwan Counterpart Application", issued on Jan. 14, 2016, p. 1-p. 4.

* cited by examiner

*Primary Examiner* — Thanh Y Tran
(74) *Attorney, Agent, or Firm* — J.C. Patents

(57) ABSTRACT

Provided is a semiconductor device including a metal oxide semiconductor transistor, a Zener diode, and a resistor. The metal oxide semiconductor transistor includes a gate, a source and a drain. The resistor has one end electrically connected to the drain, wherein the resistor includes a high resistance which is sufficient for flowing most of current to pass the metal oxide semiconductor transistor. The Zener diode includes a cathode and an anode, in which the cathode is electrically connected the gate and another end of the resistor, and the anode is electrically connected to a gate body.

10 Claims, 8 Drawing Sheets

SEMICONDUCTOR DEVICE HAVING HIGH-RESISTANCE CONDUCTOR STRUCTURE, METHOD OF MANUFACTURING THE SAME AND METHOD OF OPERATING THE SAME

BACKGROUND OF THE INVENTION

1. Field of the Invention

The invention relates to a semiconductor device, and more particularly, to a high-voltage semiconductor device, and methods of manufacturing the same and operating the same.

2. Description of Related Art

A high-voltage element process has been widely used for Power Management IC (PMIC), switching mode power supply (SMPS) and light emitting diode (LED). In recent year, green power are emphasized, which require higher conversion efficiency and low standby power consumption, so that the LED has been widely used for lighting. Generally, LED drivers are classified into Linear LED drivers and Switch mode LED drivers.

High Voltage Linear LED circuits use High Voltage Depletion MOS or High Voltage Junction Field Effect Transistor (HV-JFET) as a current source. However, HV-JFET needs larger drift region area to form RESURF (Reduced Surface Field) and a pinch off characterization of HV-JFET is relatively less sharp. In contrast, HV-DMOS may increase drain current by utilizing voltage drop between gate and source, wherein drain current of HV-DMOS is greater than drain current of HV-JFET. Accordingly, high-voltage elements usually use HV-DMOS to accomplish less area for elements while improving performance of drain current.

SUMMARY OF THE INVENTION

The invention provides a semiconductor device capable of increasing the drain current with a slight increase in the area.

The method of manufacturing the semiconductor device of the invention is compatible with existing high-voltage semiconductor device process without adding extra photomasks or process steps.

The invention provides a semiconductor device including a metal oxide semiconductor transistor, a Zener diode, and a high-resistance conductor structure. The metal oxide semiconductor transistor is disposed on a substrate, in which the metal oxide semiconductor transistor includes a high-voltage well region of a first conductivity type disposed in the substrate; an isolation structure disposed on the high-voltage well region; a source region of the first conductivity type disposed in the high-voltage well region at a first side of the isolation structure; a drain region of the first conductivity type disposed in the high-voltage well region at a second side of the isolation structure and a gate structure disposed on the high-voltage well region, and extended to partially cover the isolation structure. The Zener diode is disposed on the substrate, in which the Zener diode includes: an anode electrically connected to a body gate; and a cathode electrically connected to the gate structure. The high-resistance conductor structure is disposed above the isolation structure, in which the high-resistance conductor structure is a continuous structure, in which a first end of the high-resistance conductor structure is electrically connected to the drain region, and a second end of the high-resistance conductor structure is electrically connected to the cathode of the Zener diode and the gate structure.

In an embodiment of the invention, a doping depth of the high-voltage well region below the gate structure is less than doping depths of high-voltage well region below the source region and the drain region.

In an embodiment of the invention, the metal oxide semiconductor transistor further includes a top layer of a second conductivity type, disposed in the high-voltage well region below the isolation structure.

In an embodiment of the invention, the metal oxide semiconductor transistor further includes a lightly doped layer of the first conductivity type, disposed between the isolation structure and the top layer.

In an embodiment of the invention, the Zener diode includes: a first well region of the first conductivity type disposed in the substrate; a first doped region of a second conductivity type disposed in the first well region; a body region of the first conductivity type disposed in the first well region, in which the body region is disposed below the first doped region; a second doped region of the first conductivity type disposed in the first well region at a first side of the first doped region; a third doped region of the first conductivity type disposed in the first well region at a second side of the first doped region; a second well region of the second conductivity type disposed in the substrate, and adjacent to the first well region; and a fourth doped region of the second conductivity type disposed in the second well region.

In an embodiment of the invention, the substrate includes: a body; an epitaxial layer of the second conductivity type disposed on the body; and an embedded layer of the first conductivity type disposed between the epitaxial layer and the body.

In an embodiment of the invention, the metal oxide semiconductor transistor further includes a first well region of a second conductivity type, disposed within the high-voltage well region between the isolation structure and the source region; a first field region of the second conductivity type, disposed in the first well region; and a first doped region of the second conductivity type disposed in the first field region, in which the first doped region is electrically connected to a body gate and adjacent to the gate structure.

In an embodiment of the invention, the metal oxide semiconductor transistor further comprises a top layer of the second conductivity type, disposed in the high-voltage well region below the isolation structure.

In an embodiment of the invention, the metal oxide semiconductor transistor further comprises a lightly doped layer of the first conductivity type, disposed between the isolation structure and the top layer.

In an embodiment of the invention, the Zener diode includes: a second well region of the first conductivity type disposed in the substrate; a second doped region of the second conductivity type disposed in the second well region; a body region of the first conductivity type disposed in the second well region, in which the body region is disposed below the second doped region; a third doped region of the first conductivity type disposed in the second well region at a first side of the second doped region; a fourth doped region of the first conductivity type disposed in the second well region at a second side of the second doped region; a third well region of the second conductivity type disposed in the substrate, and adjacent to the first well region; a second field region of the second conductivity type, disposed in the third well region; and a fifth doped region of the second conductivity type electrically connected to the body gate, disposed in the second field region.

The invention provides a method of manufacturing a semiconductor device, including: forming a metal oxide semiconductor transistor on a substrate forming a Zener diode on the substrate at a first side of the metal oxide semiconductor transistor, and forming a high-resistance conductor structure. The Zener diode includes an anode and a cathode, the anode is electrically connected to a body gate, and a cathode is electrically connected to a gate of a gate structure of the metal oxide semiconductor transistor. The high-resistance conductor structure is a continuous structure. The first doped region and the fourth doped region are served as the anode of the Zener diode; the second doped region and the third doped region are served as the cathode of the Zener diode; and a first end of the high-resistance conductor structure is electrically connected to the drain region, a second end of the high-resistance conductor structure is electrically connected to the cathode of the Zener diode and the gate of the gate structure of the metal oxide semiconductor transistor.

In an embodiment of the invention, the step of forming the Zener diode includes: forming a first well region of a first conductivity type in the substrate; forming a first doped region of a second conductivity type in the first well region; forming a body region of the first conductivity type in the first well region, in which the body region is disposed below the first doped region; forming a second doped region of the first conductivity type in the first well region at a first side of the first doped region; forming a third doped region of the first conductivity type in the first well region at a second side of the first doped region; forming a second well region of the second conductivity type in the substrate, and the second well region being adjacent to the first well region; forming a fourth doped region of the second conductivity type in the second well region; and forming a high-resistance conductor structure.

In an embodiment of the invention, the step of forming the Zener diode further comprises forming a second field region in the second well region, and the fourth doped region is formed in the second field region.

In an embodiment of the invention, the step of forming the metal oxide semiconductor transistor includes: forming a high-voltage well region of the first conductivity type in the substrate; forming an isolation structure on the high-voltage well region; forming a source region of the first conductivity type in the high-voltage well region at a first side of the isolation structure; forming a drain region of the first conductivity type in the high-voltage well region at a second side of the isolation structure; and forming the gate structure on the high-voltage well region, in which the gate structure partially covers the isolation structure, and a doping depth of the high-voltage well region below the gate structure is less than doping depths of high-voltage well region below the source region and the drain region.

In an embodiment of the invention, the step of forming the metal oxide semiconductor transistor further includes forming a top layer of a second conductivity type, disposed in the high-voltage well region below the isolation structure; and forming a lightly doped layer of the first conductivity type, disposed between the isolation structure and the top layer.

In an embodiment of the invention, the step of forming the metal oxide semiconductor transistor includes: forming a high-voltage well region of the first conductivity type in the substrate; forming an isolation structure on the high-voltage well region; forming a source region of the first conductivity type in the high-voltage well region at a first side of the isolation structure; forming a drain region of the first conductivity type in the high-voltage well region at a second side of the isolation structure; forming the gate structure on the high-voltage well region, in which the gate structure partially covers the isolation structure; forming a third well region of the second conductivity type in the high-voltage well region between the isolation structure and the source region; forming a first field region of the second conductivity type in the third well region; and forming a fifth doped region of the second conductivity type in the first field region, in which the fifth doped region is electrically connected to the body gate and adjacent to the gate structure.

In an embodiment of the invention, the step of forming the metal oxide semiconductor transistor further includes forming a top layer of a second conductivity type, disposed in the high-voltage well region below the isolation structure; and forming a lightly doped layer of the first conductivity type, disposed between the isolation structure and the top layer.

The invention further provides a semiconductor device including a metal oxide semiconductor transistor, a Zener diode, and a resistor. The metal oxide semiconductor transistor includes a gate, a source and a drain. The resistor has one end electrically connected to the drain, wherein the resistor includes a high resistance which is sufficient for flowing most of current to pass the metal oxide semiconductor transistor. The Zener diode includes a cathode and an anode, in which the cathode is electrically connected the gate and another end of the resistor, and the anode is electrically connected to a gate body.

The invention further provides a method of operating aforementioned semiconductor device, including: applying a drain voltage being 0V to 600V to the drain, and applying a zero voltage or a negative voltage to the body gate.

The invention further provides a method of operating aforementioned semiconductor device, including applying a drain voltage being 0V to 600V to the drain, applying a voltage being 0V to the source, and applying a negative voltage to the body gate, for making the metal oxide semiconductor transistor to reach a pinch off state.

Based on above, the semiconductor device of the invention includes the metal oxide semiconductor transistor, the Zener diode, and the high-resistance conductor structure. The high-resistance may serve as a high-resistance resistor from providing the voltage drop for the Zener diode, so that the Zener diode may generate the voltage difference to the gate of the metal oxide semiconductor transistor to raise the gate voltage, so as to increase the drain current. Because the high-resistance conductor structure served as the high-resistance resistor may be disposed on the isolation structure originally provided on the semiconductor device without increasing additional layout areas while the area occupied by the Zener diode is quite small, such that the invention is capable of increasing the current with a slight increase in the area. Further, the invention is capable of adjusting the doping depth of the high-voltage well region below the gate structure by utilizing the patterned mask layer and the ion implantation process. In addition, the method of manufacturing the semiconductor device of the invention is compatible with existing high-voltage semiconductor device process without adding extra photomasks or process steps.

To make the above features and advantages of the disclosure more comprehensible, several embodiments accompanied with drawings are described in detail as follows.

DESCRIPTION OF THE EMBODIMENTS

Figure 1A:
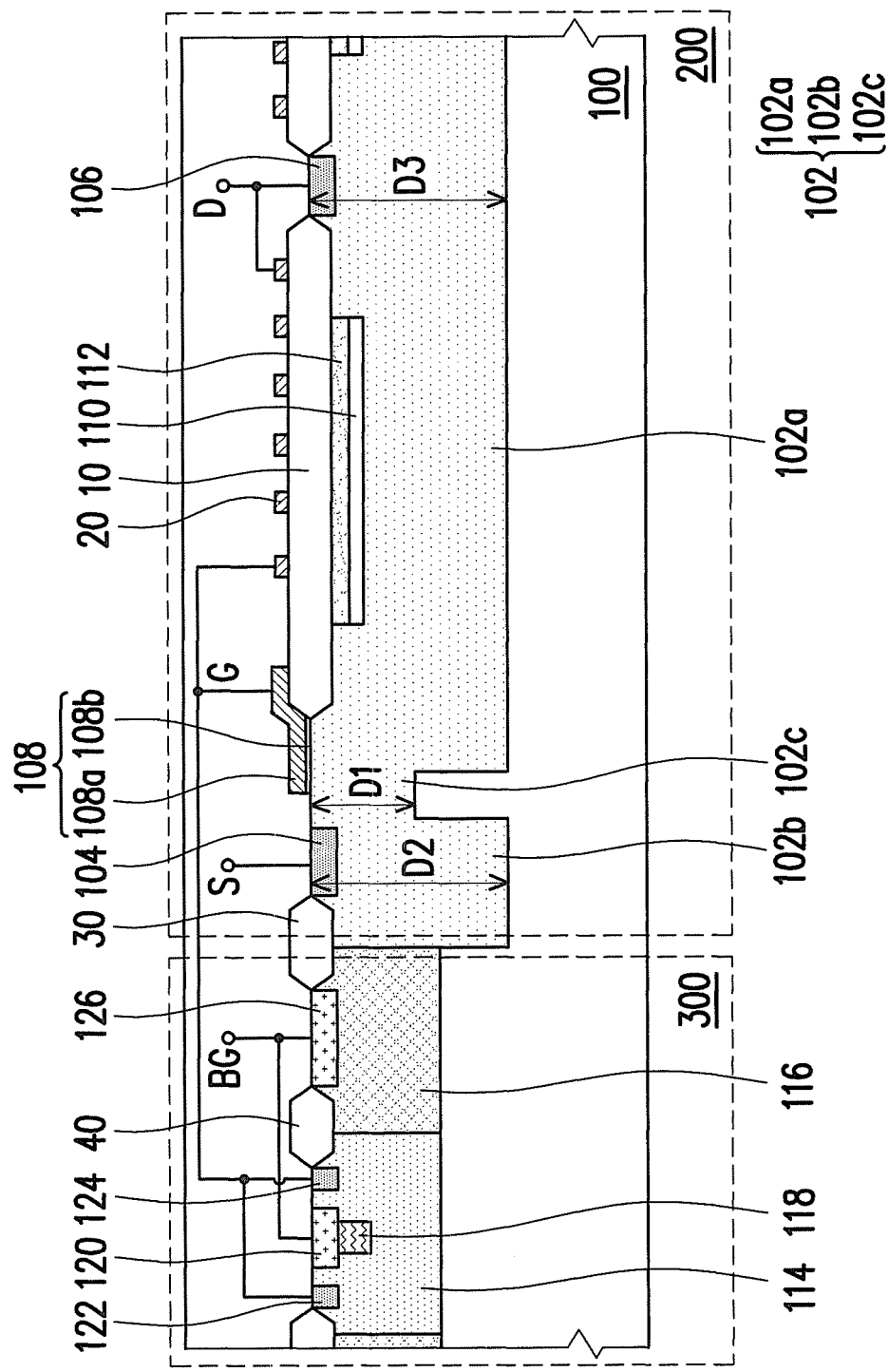
FIG. 1A is a cross-sectional diagram of a semiconductor device according to first embodiment of the invention.

In the following embodiments, when the first conductivity type is an N-type, the second conductivity type is a P-type; and when the first conductivity type is the P-type, the second conductivity type is the N-type. A P-type dopant is, for example, boron; an N-type dopant is, for example, phosphorous or arsenic. The present embodiment is illustrated by using the first conductivity type as the N-type and the second conductivity type as the P-type for example, but the invention is not limited thereto. Further, the same reference numerals represent the same or similar elements in the following embodiments.

Figure 1B:
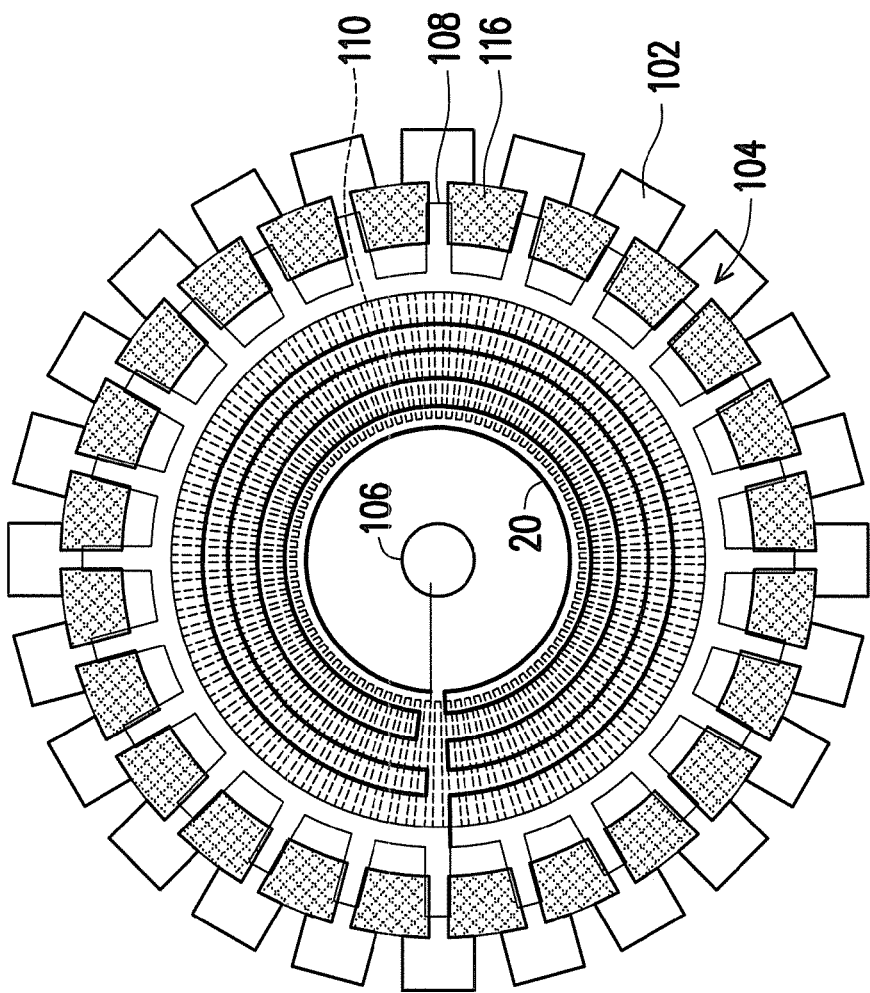
FIG. 1B is a top view of the semiconductor device of FIG. 1A.

FIG. 1A is a cross-sectional diagram of a semiconductor device according to first embodiment of the invention. FIG. 1B is a top view of the semiconductor device of FIG. 1A. Referring to FIG. A, a semiconductor device according to first embodiment of the invention includes a metal oxide semiconductor transistor 200, a Zener diode 300 and a high-resistance conductor structure 20. The metal oxide semiconductor transistor 200 is disposed on a substrate 100. The Zener diode 300 is disposed on the substrate 100 and adjacent to the metal oxide semiconductor transistor 200. A material of the substrate 100 may be at least one material selected from a group consisting of Si, Ge, SiGe, GaP, GaAs, SiC, SiGeC, InAs and InP. The substrate 100 may also be a silicon-on-insulating (SOI) substrate.

The metal oxide semiconductor transistor 200 may be a depletion mode metal oxide semiconductor transistor, but the invention is not limited thereto. The metal oxide semiconductor transistor 200 includes a high-voltage well region 102 of the first conductivity type, an isolation structure 10, a gate structure 108, a source region 104 of the first conductivity type, and a drain region 106 of the first conductivity type.

The high-voltage well region 102 of the first conductivity type is disposed in the substrate 100. In the present embodiment of the invention, the high-voltage well region 102 may be divided into three portions including high-voltage well regions 102a, 102b and 102c. The high-voltage well region 102c is disposed between the high-voltage well region 102a and the high-voltage well region 102b. More specifically, the high-voltage well region 102c is disposed below the gate structure 108, and a doping depth D1 thereof is less than doping depths D2 and D3 of the high-voltage well region 102 below the source region 104 and the drain region 106. A method of forming the high-voltage well regions 102a, 102b and 102c includes forming a patterned mask layer on the substrate 100. The patterned mask layer covers the substrate 100 on which the high-voltage well region 102 is to be formed, and exposes the substrate 100 on which the high-voltage well regions 102a and 102b are to be formed. Next, an ion implantation process is performed, so as to form the high-voltage well regions 102a and 102b. After that, a thermal process is performed. A dopent implemented in the high-voltage well regions 102a and 102b is diffused to a region below the gate structure 108 to form the high-voltage well region 102c. Due to difference in dopant concentration gradients, the doping depth of the high-voltage well region 102c formed by diffusion is less than the doping depths of the high-voltage well regions 102a and 102b. In an embodiment, a dopent implemented in the high-voltage well region 102 is, for example, phosphorous or arsenic; a doping dosage thereof is, for example, $1 \times 10^{11}/cm^2$ to $8 \times 10^{12}/cm^2$.

The isolation structure 10 is disposed on the high-voltage well region 102. A material of the isolation structure 10 is, for example, doped or undoped silicon oxides, a low stress silicon nitride, a silicon oxynitride or a combination thereof and a method of forming the same includes a local oxidation (LOCOS), a shallow trench isolation (STI) or a deep trench isolation (DTI).

The source region 104 of the first conductivity type is disposed in the high-voltage well region 102 at a first side of the isolation structure 10. The drain region 106 of the first conductivity type is disposed in the high-voltage well region 102 at a second side of the isolation structure 10. The source region 104 and the drain region 106 may be formed by forming a patterned mask layer and performing an ion implantation process. In an embodiment, a dopant implemented in the source region 104 and the drain region 106 is, for example, phosphorous or arsenic; a doping dosage thereof is, for example, $8 \times 10^{14}/cm^2$ to $1 \times 10^{16}/cm^2$.

The gate structure 108 is disposed on the high-voltage well region 102 and partially covers the isolation structure 10. More specifically, the gate structure 108 includes a gate 108a and a gate dielectric layer 108b. A method of forming the gate dielectric layer 108b and the gate 108a includes forming a gate dielectric material layer and a gate material layer. A material of the gate material layer includes polysilicon, metal, silicide, or a combination thereof and a method of forming the same is, for example, a chemical vapor deposition. A material of the gate dielectric layer is, for example, a silicon oxide, a silicon nitride, or a high dielectric constant material with a dielectric constant greater than 4, and a method of forming the same includes a thermal oxidation or a chemical vapor deposition, for example. Thereafter, the gate dielectric material layer and the gate material layer may be patterned by utilizing a photolithography process and an etching process.

In the present embodiment, the metal oxide semiconductor transistor 200 may reach a pinch off state by applying a voltage to a body gate. Accordingly, a pinch-off voltage of the metal oxide semiconductor transistor 200 may be adjusted by using the high-voltage well region 102 with different doping depths. In the present embodiment, the doping depth D1 of the high-voltage well region 102c is less than the doping depths D2 and D3 of the high-voltage well regions 102a and 102b. Therefore, a pinch off characterization of the metal oxide semiconductor transistor 200 may be sharper.

In an exemplary embodiment, the metal oxide semiconductor transistor 200 may further include a top layer 110 of the second conductivity type and a lightly doped layer 112 of the first conductivity type. The top layer 110 is disposed in the high-voltage well region 102 below the isolation structure 10. The top layer 110 has capability of Reduced Surface Field (RESURF) for raising a breakdown voltage of the metal oxide semiconductor transistor 200. The top layer 110 may be formed by forming a patterned mask layer and performing an ion implantation process. In an embodiment, a dopant implemented in the top layer 110 is, for example, boron; a doping dosage thereof is, for example, $5\times10^{11}/cm^2$ to $5\times10^{13}/cm^2$. The light doped region 112 is disposed between the isolation structure 10 and the top layer 110. The lightly doped layer 112 may reduce an on-state resistance at where it is disposed, so as to increase a drain current of the metal oxide semiconductor transistor 200. The lightly doped layer 112 may be formed by forming a patterned mask layer and performing an ion implantation process. In an embodiment, a dopant implemented in the lightly doped layer 112 is, for example, phosphorous or arsenic; a doping dosage thereof is, for example, $5\times10^{11}/cm^2$ to $2\times10^{13}/cm^2$.

The high-resistance conductor structure 20 is disposed above the isolation structure 10. In the cross-sectional diagram of FIG. 1A, the high-resistance conductor structure 20 is illustrated as portions separated from one another. However, the high-resistance conductor structure 20 is in fact a continuous structure (as depicted in FIG. 1B). Referring to FIG. 1B, a first end of the high-resistance conductor structure 20 is electrically connected to the drain region 106, and a second end of the high-resistance conductor structure 20 is electrically connected to the gate structure 108 and the Zener diode 300. Incidentally, despite that FIG. 1B illustrates the semiconductor device in a circular shape and illustrates the high-resistance conductor structure 20 in a spiral shape or a ring shape, but the invention is not limited thereto. A shape of the semiconductor device of the invention may be designed according to actual requirements, and the shape may be circle, ellipse, and octagon or a combination thereof, whereas the shape of the high-resistance conductor structure 20 may be changed according to the shape of the semiconductor device. In addition, the semiconductor device according to other embodiments of the invention may also adjust the drain current and a saturation current thereof by utilizing a multi-channel.

In the present embodiment, the high-resistance conductor structure 20 may be referred to as a high-resistance resistor. A method of forming the high-resistance conductor structure 20 may include, for example, forming a conductive material layer, then, patterning the conductive material layer by utilizing a photolithography process. A material of the conductive material layer may be, for example, a doped polysilicon, an undoped polysilicon or a combination thereof and a method of forming the same may include a chemical vapor deposition. The resistance of the high-resistance conductor structure 20 can be adjusted by using the doping dosage of ion implantation. In an embodiment, a dopant implemented in the high-resistance conductor structure 20 is, for example, phosphorous a doping dosage thereof is, for example, $1\times10^{13}/cm^2$ to $1\times10^{15}/cm^2$. The Zener diode 300 is adjacent to the metal oxide semiconductor transistor 200. The Zener diode 300 includes a well region 114 of the first conductivity type, a well region 116 of the second conductivity type, a body region 118 of the first conductivity type, a doped region 120 of the second conductivity type, the doped region 122 of the first conductivity type, the doped region 124 of the first conductivity type and a doped region 126 of the second conductivity type. The doped region 120 and the doped region 126 may be served as an anode of the Zener diode 300 electrically connected to a body gate (BO). The doped region 122 and the doped region 124 may be served as a cathode of the Zener diode 300 electrically connected to the gate 108a and the high-resistance conductor structure 20.

More specifically, the well region 114 of the first conductivity type is disposed in the substate 100. The well region 114 may be formed by forming a patterned mask layer and performing an ion implantation process. In an embodiment, a dopant implemented in the well region 114 is, for example, phosphorous or arsenic; a doping dosage thereof is, for example, $8\times10^{11}/cm^2$ to $4\times10^{13}/cm^2$.

The well region 116 of the second conductivity type is disposed in the substrate 100 between the high-voltage well region 102 and the well region 114. The well region 116 may be formed by forming a patterned mask layer and performing an ion implantation process. In an embodiment, a dopant implemented in the well region 116 is, for example, boron; a doping dosage thereof is, for example, $5\times10^{12}/cm^2$ to $1\times10^{14}/cm^2$.

The doped region 120 of the second conductivity type is disposed in the well region 114; and the doped region 126 of the second conductivity type is disposed in the well region 116. In an embodiment, the doped region 120 and the doped region 126 may be served as the anode of the Zener diode 300 electrically connected to the body gate (BG). The doped region 120 and the doped region 126 may be formed by forming a patterned mask layer and performing an ion implantation process. In an embodiment, a dopant implemented in the doped region 120 and the doped region 126 is, for example, boron; a doping dosage thereof is, for example, $8\times10^{14}/cm^2$ to $1\times10^{16}/cm^2$.

The doped region 122 of the first conductivity type and the doped region 124 of the first conductivity type are in the well region 114, which are disposed in a first side and a second side of the doped region 120, respectively. The doped region 122 and the doped region 124 may be served as the cathode of the Zener diode 300, and electrically connected to the gate 108a and the high-resistance conductor 20. The doped region 122 and the doped region 124 may be formed by forming a patterned mask layer and performing an ion implantation process. In an embodiment, a dopant implemented in the doped region 122 and the doped region 124 is, for example, phosphorous or arsenic; a doping dosage thereof is, for example, $8\times10^{14}/cm^2$ to $1\times10^{16}/cm^2$.

The body region 118 of the first conductivity type below the doped region 120 is disposed in the well region 114. A breakdown voltage of the Zener diode 300 may be changed according to different dopant concentrations of the body region 118. The body region 118 may be formed by forming a patterned mask layer and performing an ion implantation process. In an embodiment, a dopant implemented in the body region 118 is, for example, phosphorous or arsenic; a doping dosage thereof is, for example, $8\times10^{12}/cm^2$ to $2\times10^{13}/cm^2$.

The Zener diode 300 may further include an isolation structure 30 and an isolation structure 40. The isolation structure 30 is disposed on the substrate 100 between the doped region 126 of the Zener diode 300 and the source region 104 of the metal oxide semiconductor transistor 200. The isolation structure 40 is disposed between the well region 114 and the well region 116. A material of the isolation structure 30 and the isolation structure 40 is, for example, doped or undoped silicon oxides, a low stress silicon nitride, a silicon oxynitride or a combination thereof and a method of forming the same includes a local oxidation, a shallow trench isolation or a deep trench isolation.

In brief in first embodiment of the invention, the drain current of the metal oxide semiconductor transistor 200 may be increased by utilizing the high-resistance conductor structure 20 with high resistance characteristic and the Zener diode 300. The high-resistance conductor structure 20 may be disposed on the isolation structure 10, thus the drain current may be greatly increased simply by increasing an area of the Zener diode 300. Further, the pinch-off voltage of the metal oxide semiconductor transistor 200 may be reduced by reducing the doping depth D1 of the high-voltage well region 102c below the gate structure 108. In addition, when the temperature increases, the drain current of the metal oxide semiconductor transistor 200 is decreased, whereas the breakdown voltage of the Zener diode 300 is increased to compensate influences caused by increasing of the temperature.

Figure 2:
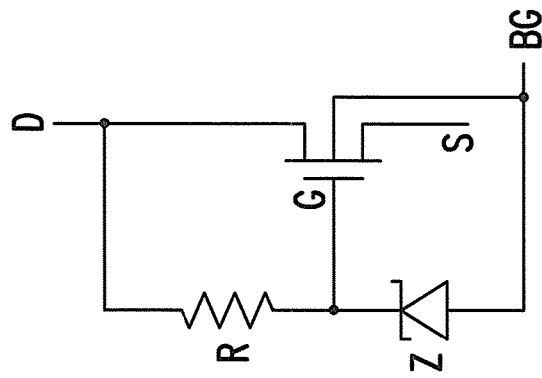
FIG. 2 is an equivalent circuit diagram of the semiconductor device of FIG. 1A.

FIG. 2 is an equivalent circuit diagram of FIG. 1A. Referring to FIG. 2, the semiconductor device of the invention includes a metal oxide semiconductor transistor, a resistor R and a Zener diode Z. The metal oxide semiconductor transistor includes a gate G, a source S and a drain D. The resistor R has an end electrically connected to the drain D. The resistor R has a high resistance sufficient for flowing most of current to pass the metal oxide semiconductor transistor. The Zener diode Z includes a cathode and an anode, in which the cathode is electrically connected the gate G and another end of the resistor R, and the anode is electrically connected to a gate body BG.

In case a high voltage Vdd is applied to the drain D of the metal oxide semiconductor transistor, due to the high resistance of the resistor R, most of current (e.g., those being greater than 99%) is flowed from the drain D to pass the metal oxide semiconductor transistor while a small part of the current (e.g., those being less than 1%) is flowed to pass the resistor R. Voltage drop is generated after the current flowed passing the resistor R, and the Zener diode Z is of reverse bias voltage at the time. Therefore, the Zener diode Z may generate a voltage difference (e.g., 4 to 10V). The voltage difference is applied to the gate G of the metal oxide semiconductor transistor for increasing a voltage of the gate G. Because the voltage of the gate G is raised, a current of the drain D is also raised. In addition, the pinch off state of the metal oxide semiconductor transistor may be controlled by a voltage applied to the body gate BO. The metal oxide semiconductor transistor may reach the pinch off state by applying a voltage being, for example, 0V or a negative voltage to the body gate BG. The pinch-off voltage is −15V, for example.

Referring to FIG. 2, for instance, in case a voltage Vdd being 0V to 5V is applied to the drain D during operations and voltages of the body gate BG and the source S are of 0V, most of the current is flowed to the metal oxide semiconductor transistor while the rest of the current (approximately $1 \times 10^{-7}$ A) is flowed to the resistor R and the Zener diode Z, and a gate-to-source voltage Vg is raised from 0V to 5V, such that the drain current is increased with increase of the gate-to-source voltage Vgs.

Furthermore, in case the voltage Vdd applied to the drain D is between 5.1V and 600V, and the voltages of the body gate BG and the source S are of 0V, most of the current is flowed to the metal oxide semiconductor transistor while the rest of the current (approximately $1 \times 10^{-6}$ A) is flowed to the resistor R and the Zener diode Z. When the gate-to-source voltage Vg is raised to 5V, the drain current is increased with increase of the Vdd until the Vdd is greater than a predetermined value (e.g., 20V). At the time, the drain current is referred as the saturation current.

In addition, in case the voltage Vdd being 15V to 600V is applied to the drain D and the voltage of the source S is of 0V, most of the current is flowed to the metal oxide semiconductor transistor while the rest of the current is flowed to the resistor R and the Zener diode Z. When the gate-to-source voltage Vgs is raised to 5V, the drain current is increased with increase of the Vgs. At the time, the drain current is referred as the saturation current. When the negative voltage applied to the body gate BG is 15V, the drain current is of 0 A. At the time, the metal oxide semiconductor transistor reaches the pinch off state.

Figure 3:
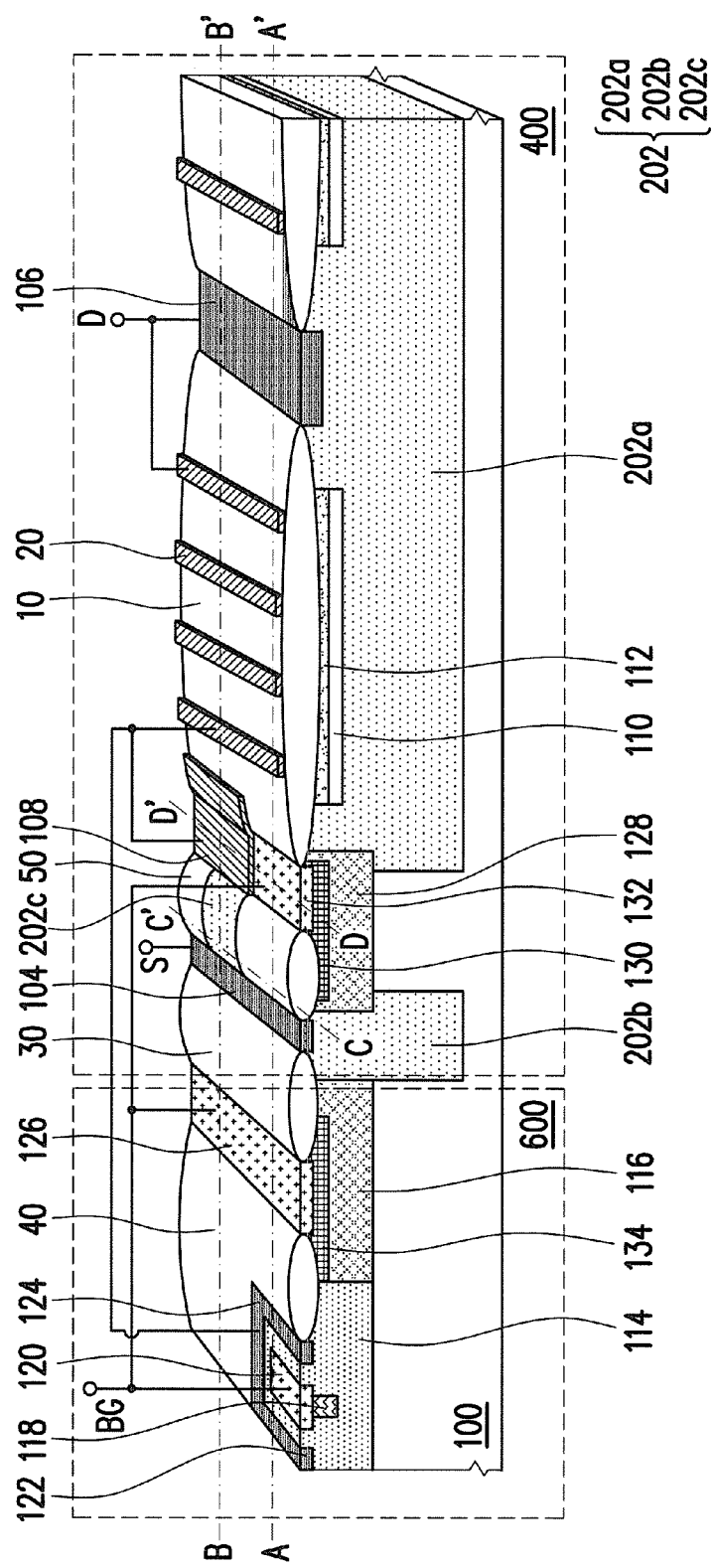
FIG. 3 is a 3D diagram of a semiconductor device according to second embodiment of the invention.
Figure 4A:
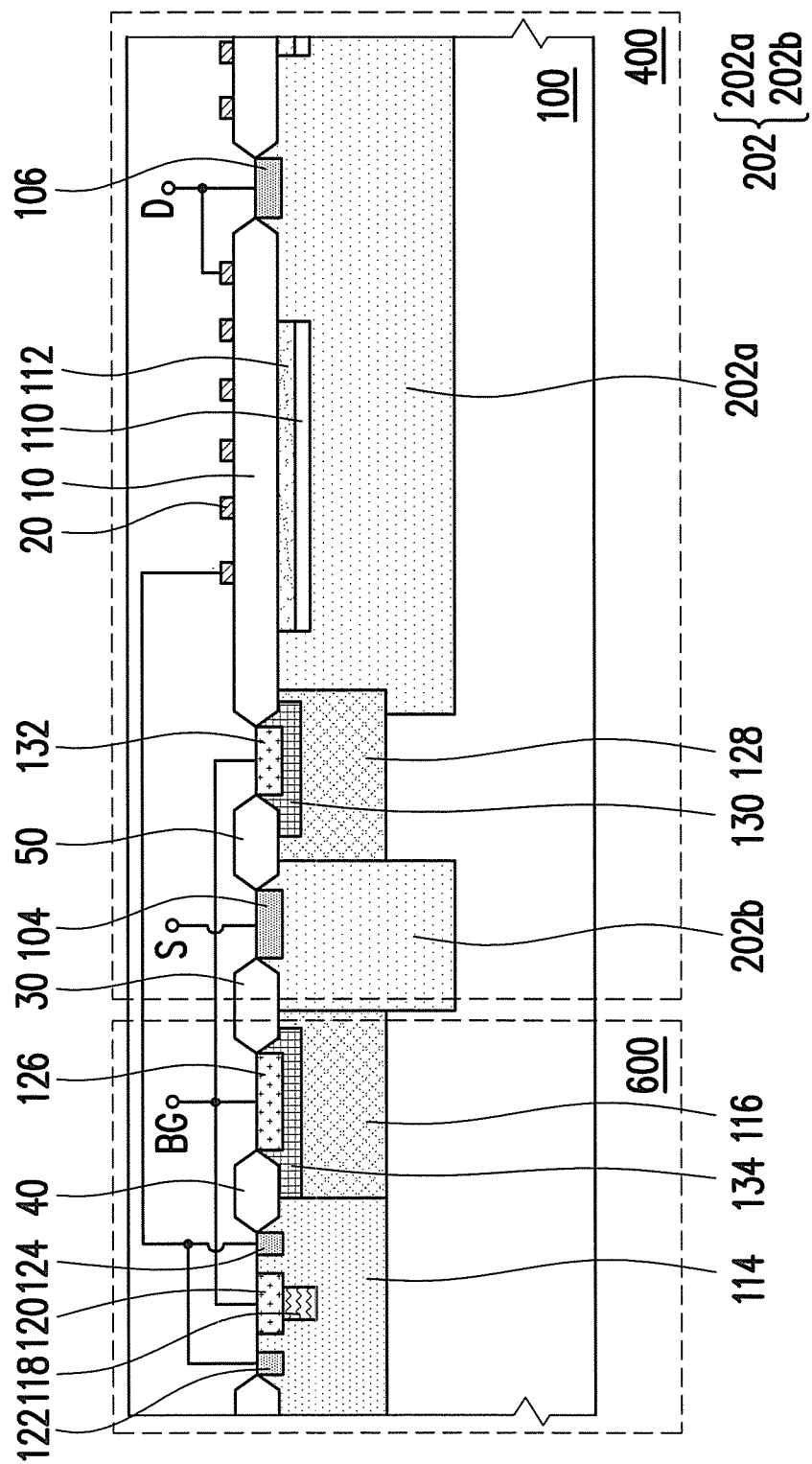
FIG. 4A is a cross-sectional view taken along line A-A' of FIG. 3.
Figure 4B:
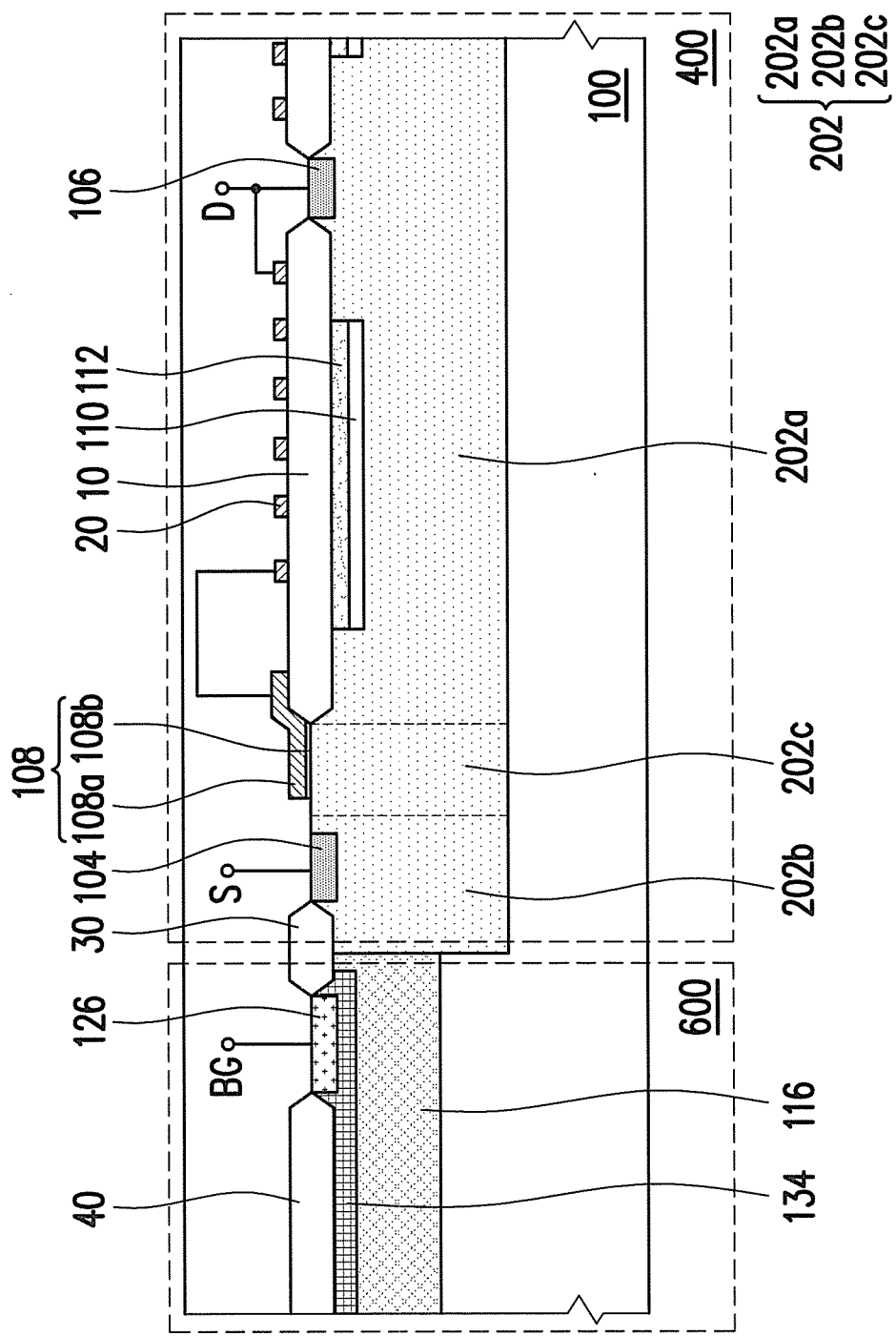
FIG. 4B is a cross-sectional view taken along line B-B' of FIG. 3.
Figure 4C:
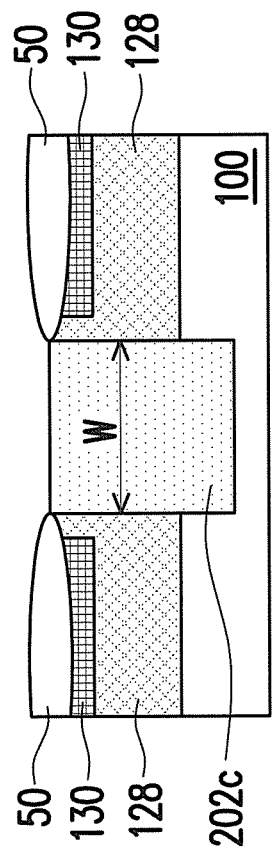
FIG. 4C is a cross-sectional view taken along line C-C' of FIG. 3.
Figure 4D:
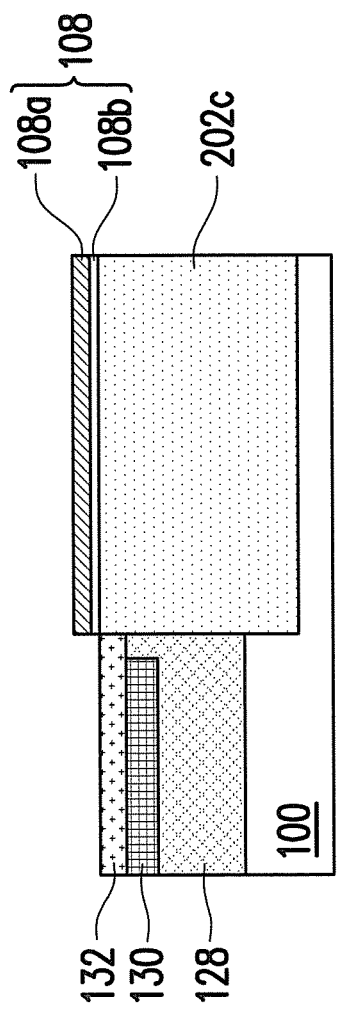
FIG. 4D is a cross-sectional view taken along line D-D' of FIG. 3.

FIG. 3 is a 3D diagram of a semiconductor device according to second embodiment of the invention. FIG. 4A is a cross-sectional view taken along line A-A' of FIG. 3. FIG. 4B is a cross-sectional view taken along line B-B' of FIG. 3. FIG. 4C is a cross-sectional view taken along line C-C' of FIG. 3. FIG. 4D is a cross-sectional view taken along line D-D' of FIG. 3.

Referring to FIG. 3 to FIG. 4B, a semiconductor device according to second embodiment of the invention includes a metal oxide semiconductor transistor 400, a Zener diode 600 and a high-resistance conductor structure 20. The metal oxide semiconductor transistor 400 and the Zener diode 600 are disposed on a substrate 100. A material of the substrate 100 is identical to that described in the foregoing embodiments, thus related description is omitted hereinafter.

The metal oxide semiconductor transistor 400 may be a depletion mode metal oxide semiconductor transistor, but the invention is not limited thereto. The metal oxide semiconductor transistor 400 includes a gate structure 108, a source region 104 of the first conductivity type, a drain region 106 of the first conductivity type, a high-voltage well region 202 of the first conductivity type, a well region 128 of the second conductivity type, a field region 130 of the second conductivity type, a doped region 132 of the second conductivity type, an isolation structure 10, and an isolation structure 50.

Referring to FIG. 3, FIG. 4B and FIG. 4D, the high-voltage well region 202 is disposed in the substrate 100. More specifically, the high-voltage well region 202 may be divided into three portions including a high-voltage well region 202a, a high-voltage well region 202b, and a high-voltage well region 202c. The high-voltage well region 202a and the high-voltage well region 202b may be connected to each other through the high-voltage well region 202c. The high-voltage well region 202c may include the same doping depth as that of the high-voltage well region 202a and the high-voltage well region 202b. In other words, the present embodiment is different from first embodiment. In the present embodiment, the doping depth of the high-voltage well region 202c disposed below the gate structure 108 is not necessarily to be shallower than the doping depths of the high-voltage well region 202a and the high-voltage well region 202b. In addition, referring to FIG. 4C, a pinch-off voltage of the metal oxide semiconductor transistor 400 may be adjusted by adjusting a width W of the high-voltage well region 202c.

The three portions including high-voltage well region 202a, the high-voltage well region 202b and the high-voltage well region 202c among the high-voltage well region 202 may be formed by forming one single patterned mask layer and performing an ion implantation process. In an embodiment, a dopant implemented in the high-voltage well region 202 is, for example, phosphorous or arsenic; a doping dosage thereof is, for example, $1 \times 10^{11}/cm^2$ to $8 \times 10^{12}/cm^2$.

Referring to FIG. 3 and FIG. 4B, the gate structure 108 is disposed on the high-voltage well region 202c and partially covers the isolation structure 10. The gate structure 108 includes a gate 108a and a gate dielectric layer 108b. A method of forming the gate 108a and the gate dielectric layer 108b is as described above and omitted hereinafter. The source region 104 and the drain region 106 is disposed in the high-voltage well region 202b, and separated by the isolation structure 50 and the gate structure 108. The source region 104 and the drain region 106 may be formed by forming a patterned mask layer and performing an ion implantation process. In an embodiment, a dopant implemented in the source region 104 and the drain region 106 is, for example, phosphorous or arsenic; a doping dosage thereof is, for example, $8 \times 10^{14}/cm^2$ to $1 \times 10^{16}/cm^2$.

The well region 128 of the second conductivity type is disposed in the substrate 100. More specifically, in view of FIG. 4A, the well region 128 is disposed between the high-voltage well region 202a and the high-voltage well region 202b. In view of FIG. 4C, the high-voltage well region 202c is sandwiched between the two portion of the well regions 128. A doping depth of the well region 128 is less than the doping depths of the high-voltage well regions 202a, 202b, and 202c. The well region 128 may be formed by forming a patterned mask layer and performing an ion implantation process. In an embodiment, a dopant implemented in the well region 128 is, for example, boron; a doping dosage thereof is, for example, $8 \times 10^{11}/cm^2$ to $8 \times 10^{13}/cm^2$.

The field region 130 of the second conductivity type is disposed in the well region 128; and the doped region 132 of the second conductivity type is disposed in the field region 130. A doping depth of the doped region 132 is, for example, 1000 Å to 4000 Å. The doped region 132 may be electrically connected to the body gate BG, and the metal oxide semiconductor transistor 400 may reach the pinch off state by controlling the voltage (e.g., the voltage being 0V or the negative voltage) applied to the body gate BG. The doped region 132 may be formed by forming a patterned mask layer and performing an ion implantation process. The doped region 132 may be formed by the ion implantation process, thus the doping depth or a profile of the doped region 132 may be adjusted by controlling the implanting energy. In an embodiment, a dopant implemented in the doped region 132 is, for example, boron; a doping dosage thereof is, for example, $8 \times 10^{14}/cm^2$ to $1 \times 10^{16}/cm^2$.

A dopant concentration of the field region 130 being greater than a dopant concentration of the well region 128 may be used to reduce the pinch-off voltage of the metal oxide semiconductor transistor 400, so that the body gate BG electrically connected to the doped region 132 can make the metal oxide semiconductor transistor 400 to reach the pinch off state more easily. In an embodiment, the dopant concentration of the filed region 130 is 80 to 120 times the dopant concentration of the well region 128. The field region 130 may be formed by forming a patterned mask layer and performing an ion implantation process. In an embodiment, a dopant implemented in the field region 130 is, for example, boron; a doping dosage thereof is, for example, $1 \times 10^{12}/cm^2$ to $1 \times 10^{14}/cm^2$.

The isolation structure 10 is disposed between the drain region 106 and the doped region 132. The isolation structure 50 is disposed between the source region 104 and the doped region 132. A material of the isolation structure 10 and the isolation structure 50 is, for example, doped or undoped silicon oxides, a low stress silicon nitride, a silicon oxynitride or a combination thereof and a method of forming the same includes a local oxidation, a shallow trench isolation or a deep trench isolation.

In an exemplary embodiment, the metal oxide semiconductor transistor 400 may further include a top layer 110 of the second conductivity type, a lightly doped layer 112 of the first conductivity type and a high-resistance conductor structure 20. Positions, materials and forming methods of the top layer 110 and the lightly doped layer 112 are identical to that described in first embodiment, thus related description is omitted hereinafter.

Referring to FIG. 4B, in the present embodiment, it is not required to control the doping depth the high-voltage well region 202c of the metal oxide semiconductor transistor 400 to be shallow for improving a sharpness of a pinch off characterization of the metal oxide semiconductor transistor 400. As shown in FIG. 3, the body gate BG can control the metal oxide semiconductor transistor 200 to reach the pinch off state through a surface layer of the doped region 132. Also, the dopant concentration of the field region 130 may be used to adjust the pinch-off voltage of the metal oxide semiconductor transistor 400. When the dopant concentration of the field region 130 is higher, the pinch-off voltage of the metal oxide semiconductor transistor 400 is smaller.

Referring to FIG. 3 and FIG. 4A, the Zener diode 600 is disposed on the substrate 100 at a first side of the metal oxide semiconductor transistor 400. The Zener diode 600 of FIG. 4A is similar to the Zener diode 300 of FIG. 1A. The Zener diode 600 further includes a field region 134 in addition to the well region 114 of the first conductivity type, the well region 116 of the second conductivity type, the body region 118 of the first conductivity type, the doped region 120 of the second conductivity type, the doped region 122 of the first conductivity type, the doped region 124 of the first conductivity type, and the doped region 126 of the second conductivity type. Related description for components in the Zener diode 600 of FIG. 3 similar to those in the Zener diode 300 of FIG. 1A are not repeated hereinafter. Particularly, it should be noted that their difference lies where the Zener diode 600 includes the field region 134. The field region 134 is disposed in the well region 116, and the doped region 126 is disposed in the field region 134. A dopant concentration of the field region 134 being greater than a dopant concentration of the well region 116 may be used to reduce the pinch-off voltage of the metal oxide semiconductor transistor 400, so that the body gate electrically connected to the doped region 126 can make the metal oxide semiconductor transistor 400 to reach the pinch off state more easily. In an embodiment, the dopant concentration of the filed doped region 134 is 100 to 130 times the dopant concentration of the well region 116.

The high-resistance conductor structure 20 is also served as the high-resistance resistor in which the position, the material, connect relation and forming method are identical to that described in first embodiment, which are not repeated hereinafer.

In the present embodiment, the body gate BG can make the metal oxide semiconductor transistor 400 to reach the pinch off state through a surface layer of the doped region 132. Also, the dopant concentration of the field region 130 being greater than the dopant concentration of the well region 128 in the invention may reduce the pinch-off voltage of the metal oxide semiconductor transistor 400. Therefore, it is easier for the doped region 132 electrically connected to the body gate to turn off the metal oxide semiconductor transistor 400. Further, the doped region 132 is formed by the ion implantation instead of being formed in a manner of a thermal diffusion. Accordingly, a desire profile may be formed. In addition, the width W of the high-voltage well region 202c may also be used to adjust the pinch-off voltage of the metal oxide semiconductor transistor 400. When the width W of the high-voltage well region 202c is smaller, the pinch-off voltage of the metal oxide semiconductor transistor 400 is also smaller.

Figure 5:
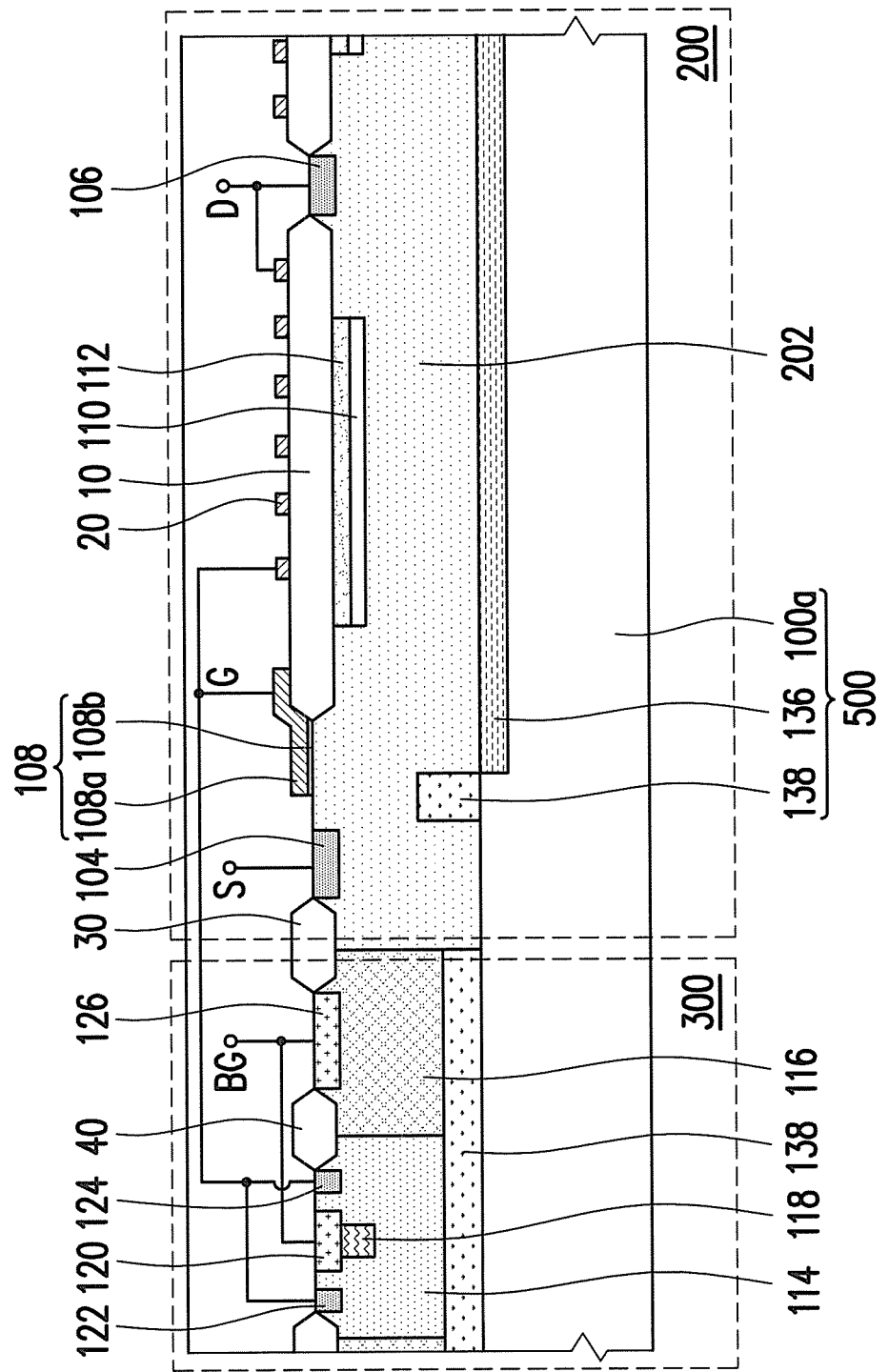
FIG. 5 is a cross-sectional diagram of a semiconductor device according to another embodiment of the invention.

FIG. 5 is a cross-sectional diagram of a semiconductor device according to another embodiments of the invention. Referring to FIG. 5, the semiconductor device of FIG. 5 is similar to the semiconductor device of FIG. 1A, a difference between the two is that a substrate 500 of FIG. S includes a body 100a, an epitaxial layer 138 of the second conductivity type, and an embedded layer 136 of the first conductivity type. A material of the body 100a may be at least one material selected from a group consisting of Si, Ge, SiGe, GaP, GaAs, SiC, SiGeC, InAs and InP. The epitaxial layer 138 is of the second conductivity type, such as an epitaxial layer having a P-type dopant disposed on the body 100a. The material of the epitaxial layer 138 includes a silicon or a silicon carbide. In an embodiment, a dopant implemented in the epitaxial layer 138 is, for example, boron; a doping dosage thereof is, for example, $8 \times 10^{12}/cm^2$ to $8 \times 10^{14}/cm^2$. The embedded layer 136 is of the first conductivity type, such as an N-type embedded layer disposed between the epitaxial layer 138 and the body 100a. The embedded layer 136 is capable of raising the breakdown voltage of the semiconductor device. The embedded layer 136 may be formed, before forming the epitaxial layer 138, on a surface of the body 100a to which the metal oxide semiconductor transistor 200 is to be formed, by forming a patterned mask layer and performing an ion implantation. In an embodiment, a dopant implemented in the embedded layer 136 is, for example, phosphorous or arsenic; a doping dosage thereof is, for example, $1 \times 10^{13}/cm^2$ to $1 \times 10^{15}/cm^2$.

Components of the metal oxide semiconductor transistor 200, the Zener diode 300, and the high-resistance conductor structure 20 are formed in or above the epitaxial layer 138 of the second conductivity type, and methods of forming the same are as described above, thus related description is omitted hereinafter.

Figure 6:
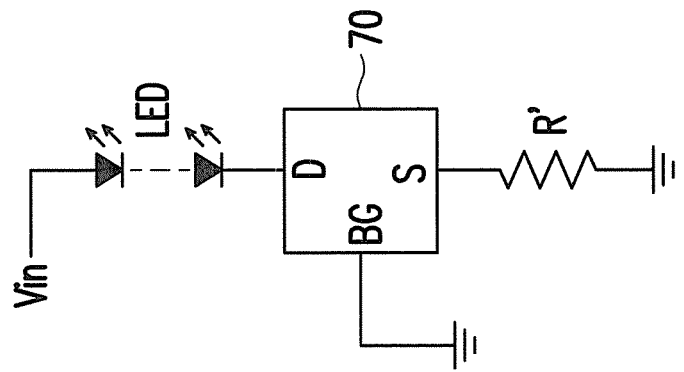
FIG. 6 is an equivalent circuit diagram of a LED driven by using the semiconductor device of the invention.

FIG. 6 is an equivalent circuit diagram of a LED driven by using the semiconductor device of the invention. Referring to FIG. 6, an example of the semiconductor device of the invention being applied as a driving circuit of a LED is provided, in which a semiconductor device (driving circuit) 70 of the invention is connected to a negative electrode of a light-emitting diode string LED. In the driving circuit 70, the body gate BG is connected to the ground, the source S is connected to the ground through the resistor R', and the drain D is connected to the negative electrode of the light-emitting diode string LED. Said resistor R' is optional, which may be omitted based on actual requirements. Based on said operating method as above, the driving circuit 70 may provide a great driving current (drain current) to drive the light-emitting diode string LED. As described above, a circuitry with the semiconductor device of the invention is capable of providing the greater drain current without increasing a layout area for the elements. Accordingly, by using a circuit design adopting the circuitry with the semiconductor device of the invention, the great drain current may be provided to the LED for driving or dimming without overly increasing the area.

Figure 7:
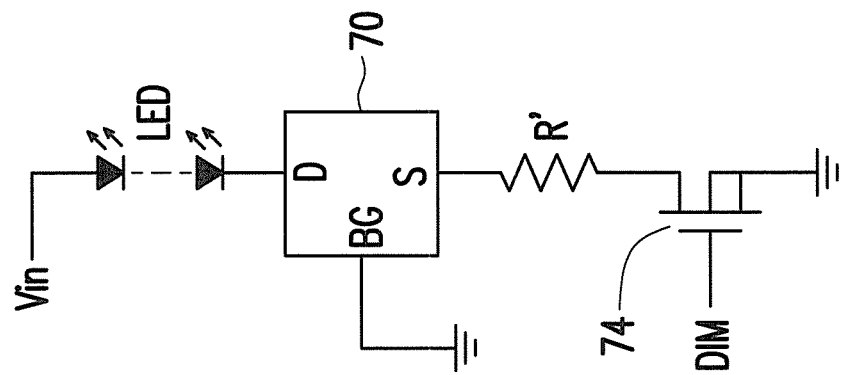
FIG. 7 is an equivalent circuit diagram of an example by using the circuit shown in FIG. 6.

FIG. 7 is an equivalent circuit diagram of an example by using the circuit shown in FIG. 6. As shown in FIG. 7, which is an example on basis of FIG. 6, further including a dimming circuit 74. A brightness of the light-emitting diode LED may be adjusted by inputting a dimming control signal DIM.

In view of above, the semiconductor device of the invention includes the metal oxide semiconductor transistor, the Zener diode, and the high-resistance resistor. The high-resistance resistor may provide the voltage drop for the Zener diode, so that the Zener diode may generate the voltage difference to the gate of the metal oxide semiconductor transistor to raise the gate voltage, so as to increase the drain current. Because the high-resistance conductor structure served as the high-resistance resistor may be disposed on the isolation structure originally provided on the semiconductor device without increasing additional layout areas while the area occupied by the Zener diode is quite small, such that the invention is capable of increasing the current with a slight increase in the area. Furthermore, the Zener diode of the invention is capable of stabilizing voltage. Moreover, in some embodiments, the invention is capable of reducing the pinch-off voltage of the metal oxide semiconductor transistor by reducing the doping depth of the high-voltage well region or reducing the width of the high-voltage well region. In another embodiment, by disposing the doped region electrically connected to the body gate in the Zener diode, the metal oxide semiconductor transistor may reach the pinch off state through the surface of the doped region, namely, the pinch off characterization of the metal oxide semiconductor transistor may be shaper. Also, the pinch-off voltage of the metal oxide semiconductor transistor may be reduced by disposing the field region. In addition, the method of manufacturing the semiconductor device of the invention is compatible with existing high-voltage semiconductor device process without adding extra photomasks or process steps. In addition, by using the circuit design with the circuitry adopting the semiconductor device of the invention, the great drain current may be provided to the LED for driving or dimming without overly increasing the area. Furthermore, when the dimming circuit is added on basis of the circuitry adopting the semiconductor device of the invention, the brightness of the light emitting diode string LED may be adjusted by inputting the dimming control signal DIM.

It will be apparent to those skilled in the art that various modifications and variations can be made to the structure of the present disclosure without departing from the scope or spirit of the disclosure. In view of the foregoing it is intended that the present disclosure cover modifications and variations of this disclosure provided they fall within the scope of the following claims and their equivalents.

What is claimed is:

1. A semiconductor device, comprising:
 a metal oxide semiconductor transistor disposed on a substrate, wherein the metal oxide semiconductor transistor comprising:
 a high-voltage well region of a first conductivity type, disposed in the substrate;
 an isolation structure disposed on the high-voltage well region;
 a source region of the first conductivity type, disposed in the high-voltage well region at a first side of the isolation structure;
 a drain region of the first conductivity type, disposed in the high-voltage well region at a second side of the isolation structure; and
 a gate structure, disposed on the high-voltage well region, and extended to partially cover the isolation structure;
 a Zener diode disposed on the substrate, wherein the Zener diode comprises:
 an anode electrically connected to a body gate; and
 a cathode electrically connected to the gate structure; and
 a high-resistance conductor structure disposed above the isolation structure, wherein the high-resistance conductor structure is a continuous structure, wherein a first end of the high-resistance conductor structure is electrically connected to the drain region and a second end of the high-resistance conductor structure is electrically connected to the cathode of the Zener diode and the gate structure.

2. The semiconductor device of claim 1, wherein a doping depth of the high-voltage well region below the gate structure is less than doping depths of high-voltage well region below the source region and the drain region.

3. The semiconductor device of claim 2, wherein the metal oxide semiconductor transistor further comprises a top layer of a second conductivity type, disposed in the high-voltage well region below the isolation structure.

4. The semiconductor device of claim 3, wherein the metal oxide semiconductor transistor future comprises a lightly doped layer of the first conductivity type, disposed between the isolation structure and the top layer.

5. The semiconductor device of claim 2, wherein the Zener diode comprises:
   a first well region of the first conductivity type, disposed in the substrate;
   a first doped region of a second conductivity type, disposed in the first well region;
   a body region of the first conductivity type, disposed in the first well region, wherein the body region is disposed below the first doped region;
   a second doped region of the first conductivity type, disposed in the first well region at a first side of the first doped region;
   a third doped region of the first conductivity type, disposed in the first well region at a second side of the first doped region;
   a second well region of the second conductivity type, disposed in the substrate, and adjacent to the first well region; and
   a fourth doped region of the second conductivity type, disposed in the second well region.

6. The semiconductor device of claim 2, wherein the substrate comprises:
   a body;
   an epitaxial layer of the second conductivity type, disposed on the body; and
   an embedded layer of the first conductivity type, disposed between the epitaxial layer and the body.

7. The semiconductor device of claim 1, wherein the metal oxide semiconductor transistor further comprises:
   a first well region of a second conductivity type, disposed within the high-voltage well region between the isolation structure and the source region;
   a first field region of the second conductivity type, disposed in the first well region; and
   a first doped region of the second conductivity type, disposed in the first field region, wherein the first doped region is electrically connected to a body gate and adjacent to the gate structure.

8. The semiconductor device of claim 7, wherein the metal oxide semiconductor transistor further comprises a top layer of the second conductivity type, disposed in the high-voltage well region below the isolation structure.

9. The semiconductor device of claim 8, wherein the metal oxide semiconductor transistor further comprises a lightly doped layer of the first conductivity type, disposed between the isolation structure and the top layer.

10. The semiconductor device of claim 7, wherein the Zener diode comprises:
   a second well region of the first conductivity type, disposed in the substrate;
   a second doped region of the second conductivity type, disposed in the second well region;
   a body region of the first conductivity type, disposed in the second well region, wherein the body region is disposed below the second doped region;
   a third doped region of the first conductivity type, disposed in the second well region at a first side of the second doped region;
   a fourth doped region of the first conductivity type, disposed in the second well region at a second side of the second doped region;
   a third well region of the second conductivity type, disposed in the substrate, and adjacent to the first well region;
   a second field region of the second conductivity type, disposed in the third well region; and
   a fifth doped region of the second conductivity type electrically connected to the body gate, disposed in the second field region.

* * * * *